(12) United States Patent
Tsuchiya et al.

(10) Patent No.: US 7,514,753 B2
(45) Date of Patent: Apr. 7, 2009

(54) SEMICONDUCTOR DEVICE

(75) Inventors: Yoshinori Tsuchiya, Yokohama (JP);
Toshifumi Irisawa, Tokyo (JP);
Atsuhiro Kinoshita, Kamakura (JP);
Junji Koga, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/761,288

(22) Filed: Jun. 11, 2007

(65) Prior Publication Data

US 2007/0228486 A1    Oct. 4, 2007

Related U.S. Application Data

(62) Division of application No. 10/997,939, filed on Nov. 29, 2004, now abandoned.

(30) Foreign Application Priority Data

Dec. 5, 2003    (JP)    ............... 2003-407658
Nov. 18, 2004  (JP)    ............... 2004-334711

(51) Int. Cl.
*H01L 29/76* (2006.01)
(52) U.S. Cl. .................. 257/369; 257/412
(58) Field of Classification Search ............ 257/369, 257/412
See application file for complete search history.

(56) References Cited

U.S. PATENT DOCUMENTS 6,262,456 B1    7/2001 Yu et al.
2002/0113294 A1  8/2002 Rhee et al.
2003/0137017 A1  7/2003 Hisamoto et al.
2003/0139027 A1  7/2003 Ikeda et al.

(Continued)

FOREIGN PATENT DOCUMENTS

EP    1 328 017 A2    7/2003

(Continued)

OTHER PUBLICATIONS

Jakub Kedziershi, et al., "Metal-gate FinFET and fully-depleted SOI devices using total gate silicidation" International Electron Devices Meeting 2002 Technical Digest, 2002, pp. 247-250.

(Continued)

*Primary Examiner*—Long Pham
(74) *Attorney, Agent, or Firm*—Oblon, Spivak, McClelland, Maier & Neustadt, P.C.

(57) ABSTRACT

A semiconductor device comprises n-type and p-type semiconductor devices formed on the substrate, the n-type device including an n-channel region formed on the substrate, n-type source and drain regions formed opposite to each other interposing the n-channel region therebetween, a first gate insulator formed on the n-channel region, and a first gate electrode formed on the first gate insulator and including a compound of a metal M and a first group-IV elements $Si_{1-a}Ge_a$ ($0 \leq a \leq 1$), the p-type device including a p-channel region formed on the substrate, p-type source and drain regions formed opposite to each other interposing the p-channel region therebetween, a second gate insulator formed on the p-channel region, and a second gate electrode formed on the second gate insulator, and including a compound of the metal M and a second group-IV element $Si_{1-c}Ge_c$ ($0 \leq c \leq 1$, $a \neq c$).

9 Claims, 12 Drawing Sheets

U.S. PATENT DOCUMENTS

2003/0148563 A1    8/2003   Nishiyama
2003/0207555 A1*  11/2003   Takayanagi et al. ......... 438/590
2004/0159866 A1    8/2004   Aihara

FOREIGN PATENT DOCUMENTS

JP            2002-43566         2/2002

OTHER PUBLICATIONS

JaeHoon Lee, et al., "Tunable Work Function Dual Metal Gate Technology for Bulk and Non-Bulk CMOS", International Electron Devices Meeting 2002 Technical Digest, 2002, pp. 359-362.

C.H. Huang, et al., "Fully Silicided NiSi and Germanided NiGe Dual Gates on $SiO_2$/Si and $Al_2O_3$/Ge-On-Insulator MOSFETs" International Electron Devices Meeting 2003 Technical Digest, 2003, pp. 319-322.

S.L. Zhang, "Nickel-based contact metallization for SiGe MOSFETs: Progress and challenges", Microelectronic Engineering, vol. 70, Nov. 2-4, 2003, pp. 174-185.

D.S. Yu, et al., "Fully Silicided NiSi and Gemanided NiGe Dual Gates on $SiO_2$n- and p-MOSFETs", IEEE Electron Device Letters, vol. 24, No. 11, Nov. 2003, pp. 739-741.

E. J. Stewart, et al., "Suppresion of Boron Penetration in P-Channel MOSFETs Using Polycrystalline $Si_{1-x-y}Ge_xC_y$ Gate Layers", IEEE Electron Device Letters, XP011019066, vol. 22, No. 12, Dec. 2001, pp. 574-576.

J. C. Sturm, et al., "$Si_{1-x-y}Ge_xC_y$ Alloys: An Enabling Technology for Scaled High Performance Silicon-Based Heterojunction Devices", Silicon Monolithic Integrated Circuits in RF Systems, XP010324563, Sep. 17, 1998, pp. 3-9.

E. J. Stewart, et al., "Boron Segregation and Electrical Properties in Polycrystalline SiGeC", Mat. Res. Soc. Symp. Proc., XP008084751, vol. 669, 2001, pp. J6.9.1-J6.9.6.

* cited by examiner

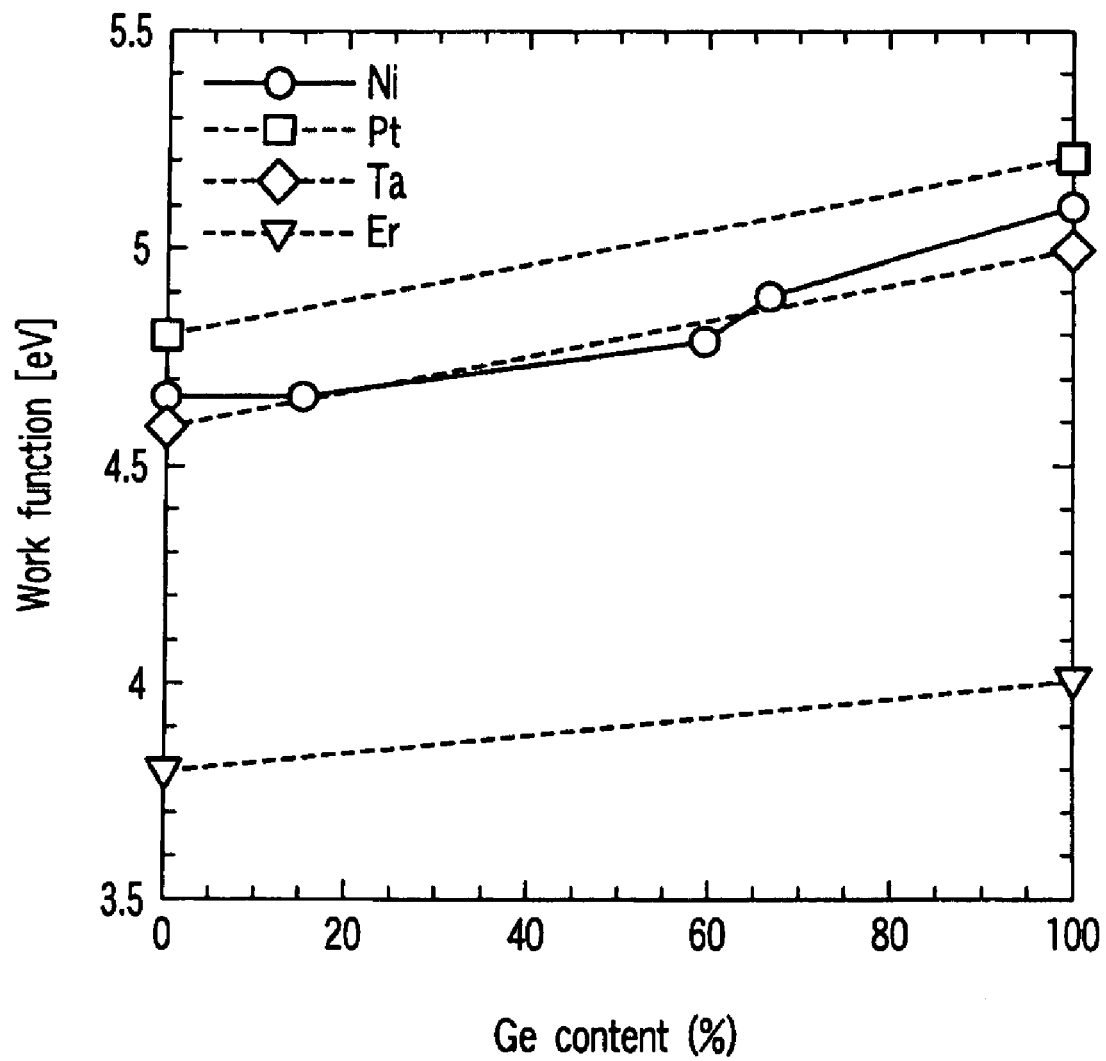
F I G. 11

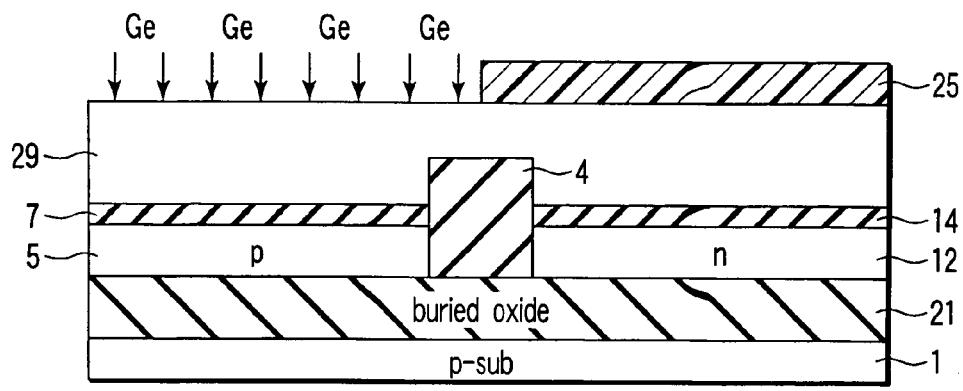
F I G. 14A
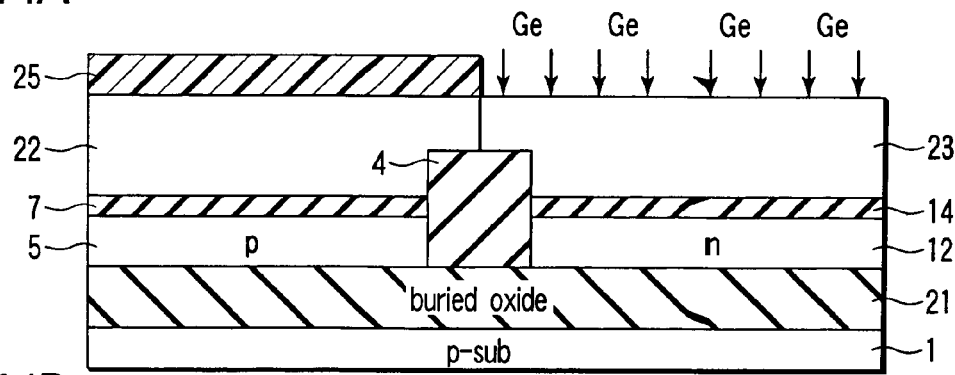
F I G. 14B
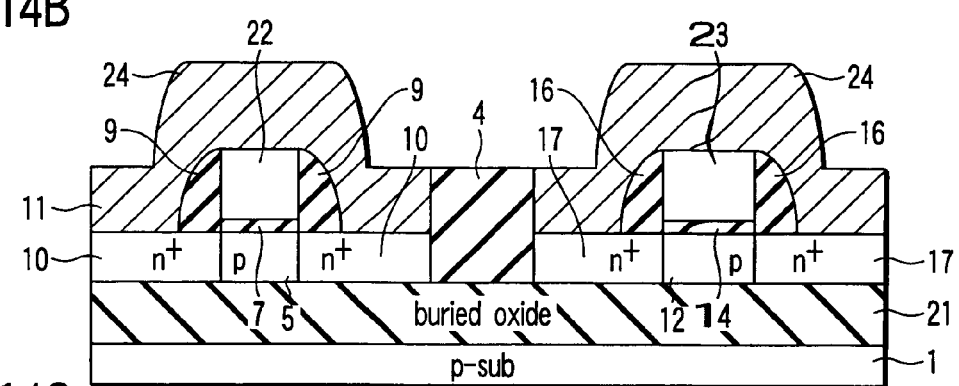
F I G. 14C
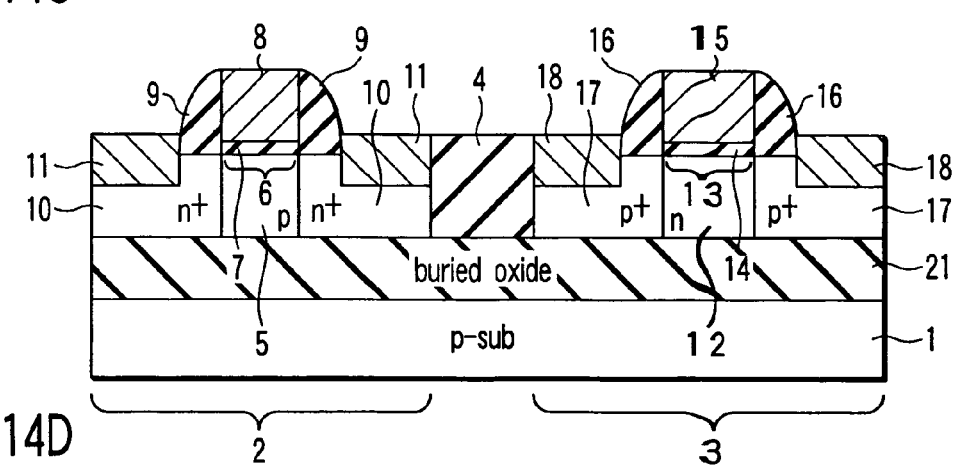
F I G. 14D

SEMICONDUCTOR DEVICE

CROSS-REFERENCE TO RELATED APPLICATIONS

This application is a Divisional of and claims the benefit of priority under 35 U.S.C. §120 from U.S. Ser. No. 10/997,939, filed Nov. 29, 2004, and claims the benefit of priority under 35 U.S.C. § 119 from prior Japanese Patent Applications No. 2003-407658, filed Dec. 5, 2003; and No. 2004-334711, filed Nov. 18, 2004, the entire contents of both of which are incorporated herein by reference.

BACKGROUND OF THE INVENTION

1. Field of the Invention

The present invention relates to a semiconductor device including a field effect transistor.

2. Description of the Related Art

In order to achieve high functionality of integrated circuits, elements forming the integrated circuits, that is, MISFETs (Metal-Insulator-Semiconductor Field Effect Transistors) and CMISFETs (Complementary-MISFETs) need to have high performance. The MISFET is a metal-insulator-semiconductor field effect transistor and the CMISFET is a complementary metal-insulator-semiconductor field effect transistor. Basically, high performance of these elements has been achieved according to scaling law. However, various problems have recently arisen due to the limitations of material properties. To describe one of the foregoing problems, there is a problem that it is difficult to control the threshold voltage of a MISFET.

Under the present circumstances, the threshold voltage is controlled by the impurity concentration of channel regions. However, if the foregoing method is employed, carrier mobility is reduced; for this reason, the on/off characteristic of the MISFET is degraded. A fully-depleted MISFET is given as the method of achieving high performance of the MISFET except for scale-down. However, the threshold voltage control for the MISFET is not achieved according to the method of controlling the impurity concentration in channel only.

In view of the foregoing reason, threshold voltage is currently attempted to control by using the work function of gate electrode materials. In the coming technical generation, as well as in the current one, different work functions are required between gate electrodes of n-type and p-type MISFETs, and it is needed that the polycrystalline silicon gate electrodes be replaced with metal electrodes to lower the resistance of the gate electrodes. However, if quite different gate electrode materials are used, the manufacturing method becomes complicated, and the cost increases. For this reason, the following method of controlling the work function has been proposed. According to the method, the same kind of compounds having different composition and concentration are used as the gate electrodes of n-type and p-type MISFETs, and thereby, the work function is controlled.

For example, various methods given below have been reported. One is a method of controlling the work function using the composition ratio of Ru and Ta of an RuTa alloy (see Jaehoon Lee et al., IEDM Tech. Dig., 2002 p. 359-362). Another is a method of using the composition ratio of NiSi and CoSi of (NiCo)Si (see J. Kedzierski et al., IEDM Tech. Dig., 2002 p. 247-250). Another is a method of using each impurity concentration of B, P and As contained in NiSi (see the same as above). Another is a method of using the composition ratio of Si and Ge of SiGe (see JPN. PAT. APPLN. KOKAI Publication No. 2002-43566).

The gate electrode material is required to have a stable correlation between the composition of the material or variations of dopant concentration and the work function. The condition is satisfied, and thereby, the control of the work function is improved with respect to the required threshold voltage. In devices including both n-type and p-type MISFETs on the same substrate, the variable range of the work function preferably includes each range required for these n-type and p-type MISFETs. In this way, it is possible to prevent complication of the manufacturing method and an increase of the cost. However, the foregoing methods do not meet the requirements described above.

More specifically, the correlation is given between the metal composition of the RuTa alloy and the work function. However, heat resistance is low, and the work function irregularly varies by heat treatment of about 500° C. or more at least. Thus, the correlation is thermally unstable. In addition, the heat treatment is carried out, and thereby, Ru or Ta of the gate electrode diffuses into the channel region. As a result, there is a problem that the on/off characteristic of the MISFET is degraded.

The compound (NiCo)Si has no stable correlation between the composition ratio of Ni:Co and the work function. The variable range of the work function is narrow, that is, about 0.2 eV.

The compound NiSi has a correlation between each impurity concentration of B, P and As contained therein and the work function. The variable range of the work function is sufficient with respect to fully-depleted MISFET devices. However, the variable range of the work function is insufficient to obtain a sufficiently low threshold voltage in a bulk MISFET device, which is not the fully-depleted MISFET device.

If SiGe is used as the gate electrode material, a correlation is given between the composition ratio of Si and Ge and the work function. However, the variable range of the work function is about 4.7 eV to about 5.2 eV. As a result, the compound SiGe is applied to a p-type MISFET only in the current technical generation.

Therefore, it is greatly desired to realize a device having a stable correlation between variation of gate electrode material and work function, in the devices having both n-type and p-type MISFETs on the same substrate. In other words, it is desired in the device to realize a semiconductor device including a gate electrode, which has a variable range of a work function including a range required for both n-type and p-type MISFETs.

BRIEF SUMMARY OF THE INVENTION

According to a first aspect of the invention, there is provided a semiconductor device which comprises:
a silicon substrate;
an n-type semiconductor device and a p-type semiconductor device, each being formed on the silicon substrate,
the n-type semiconductor device including:
an n-channel region formed on a surface of the silicon substrate;
an n-type source region and an n-type drain region formed opposite to each other on a surface of the silicon substrate interposing the n-channel region therebetween;
a first gate insulator formed on the surface of the n-channel region between the n-type source region and the n-type drain region; and
a first gate electrode formed on the first gate insulator, and including a compound of a metal element M and a first group-IV semiconductor element $S_{1-a} Ge_a$, where $0 \leq a \leq 1$, the p-type semiconductor device including:

a p-channel region formed on a surface of the silicon substrate;

a p-type source region and a p-type drain region formed opposite to each other on a surface of the substrate interposing the p-channel region therebetween;

a second gate insulator formed on the surface of the p-channel region between the p-type source region and the p-type drain region; and a second gate electrode formed on the second gate insulator, and including a compound of the metal element M and a second group-IV semiconductor element $Si_{1-c}\ Ge_c$, where $0 \leq c \leq 1$, $a \neq c$.

According to a second aspect of the invention, there is provided a semiconductor device which comprises:

a silicon substrate;

an n-type semiconductor device and a p-type semiconductor device, each being formed on the silicon substrate, the n-type semiconductor device including:

an n-channel region formed on a surface of the silicon substrate;

an n-type source region and an n-type drain region formed opposite to each other on a surface of the silicon substrate interposing the n-channel region therebetween;

a first gate insulator formed on the surface of the n-channel region between the n-type source region and the n-type drain region; and a first gate electrode formed on the first gate insulator, and including a compound of a metal element M and a first group-IV semiconductor element $Si_{1-a-b}\ Ge_a\ C_b$, where $0 \leq a \leq 1$, $0 \leq b \leq 0.02$, and $0 \leq a+b \leq 1$, the p-type semiconductor device including:

a p-channel region formed on a surface of the silicon substrate;

a p-type source region and a drain region formed opposite to each other on a surface of the silicon substrate interposing the p-channel region there-between;

a second gate insulator formed on the surface of the p-channel region between the p-type source region and the p-type drain region; and a second gate electrode formed on the second gate insulator, and including a compound of the metal element M and a second group-IV semiconductor element $Si_{1-c-d}\ Ge_c\ C_d$, where $0 \leq c \leq 1$, $0 \leq d \leq 0.02$, $0 \leq c+d \leq 1$, $a \neq c$ and at least one of b and $d \neq 0$.

BRIEF DESCRIPTION OF THE SEVERAL VIEWS OF THE DRAWING

FIG. 11 is a schematic view showing the correlation between experimentally obtained work function of Ni(SiGe) and MGe ratio used in a gate electrode of the CMISFET according to the fifth embodiment;

FIGS. 14A to 14D are cross-sectional views stepwise showing a third method of manufacturing the CMISFET according to the fifth embodiment;

DETAILED DESCRIPTION OF THE INVENTION

Figure 1:
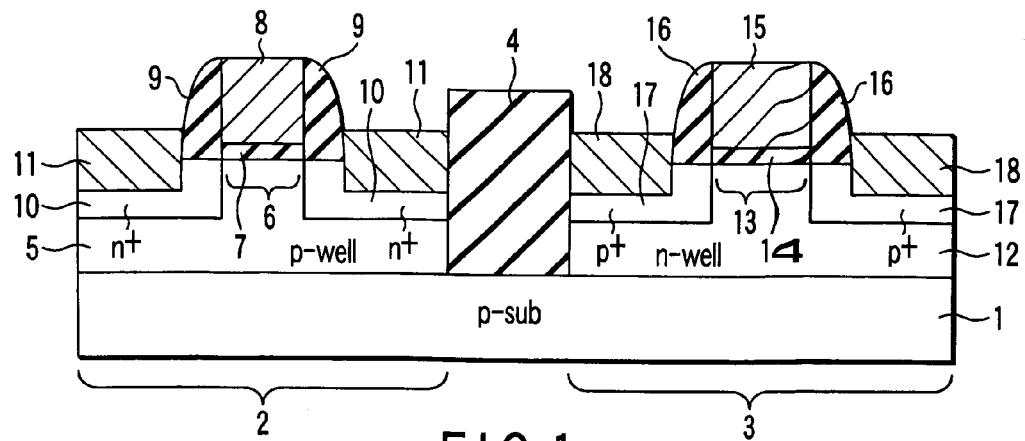
FIG. 1 is a cross-sectional view schematically showing a CMISFET according to a first embodiment of the present invention.

Embodiments of the present invention will be described below with reference to the accompanying drawings. The same reference numerals are used to designate identical components in the following embodiments, and the overlapping explanation is omitted. The drawings are schematic views prepared for further clarifying the explanation of the invention and obtaining its understanding. The shape, dimensions and ratio shown in the drawings are different from the actual device. In carrying out the invention, these features may be changed in design in view of the following description and publicly known techniques.

In the following embodiments, a CMISFET having threshold voltage of about 0.2V required for the sub-30 nm technical generation is given as an explanatory example. However, the present invention is not limited to the foregoing CMISFET, and is applicable to the device given below. The device includes n- and p-MISFETs formed on the same substrate, and has a work function different between these MISFETs because the threshold voltages required for both approximate to each other. For example, a system LSI having a memory and logic circuit embedded on the same chip is given as the device, and the foregoing features are required. Likewise, the embodiments are applicable to a MISFET using other gate dielectrics in place of Si oxides.

First Embodiment

A CMISFET according to the first embodiment will be described below with reference to FIG. 1. As shown in FIG. 1, an n-MISFET 2 and a p-MISFET 3 are formed on a p-type silicon substrate 1 in a state of being isolated from an isolation region 4.

First, the n-MISFET 2 will be explained below. A p-well 5 (p-type impurity region) is formed on the p-type silicon substrate 1. The center of the upper portion of the p-well 5 is formed with an n-channel region 6. The n-channel region calls a region formed with an n-channel when gate voltage is applied. A first gate insulator 7 is formed on the n-channel region 6, and a first gate electrode 8 is formed on the first gate insulator 7. The first gate electrode 8 is interposed between first gate sidewall insulators 9. A pair of n-type source/drain regions 10 (n-type highly-doped impurity region) is formed on the opposite position via the n-channel region 6 on the p-well 5. The upper portion of the n-type source/drain region 10 is formed with a pair of first contact electrodes 11. In the manner described above, the nMISFET 2 is formed on the p-well 5.

In contrast, the p-MISFET 3 is formed having the same elements as above except that the conductivity type is different. More specifically, n-well 12 (n-type impurity region), p-channel region 13, second gate insulator 14 and second gate electrode 15 are formed. Further, second gate sidewall insulators 16, p-type source/drain regions 17 (p-type highly-doped impurity region) and second contact electrodes 18.

Each of the first and second contact electrodes 11 and 18 is connected via interconnect. In this way, n-MISFET 2 and p-MISFET 3 form a CMISFET, which has the complementarily functions.

A compound M(SiGe) of metal element M and group IV semiconductor element SiGe is used as the material of the first and second gate electrodes 8 and 15. The M(SiGe) is a mixed crystal compound of metal silicide MSi and metal germanide MGe. The MGe ratio to MSi in the M(SiGe) has an arbitrary value from 0 to 100% as well as the material of the first and second gate electrodes 8 and 15. However, the composition is different between the gate electrodes 8 and 15. More specifically, the material of the gate electrode 8 is $M(Si_{1-a}Ge_a)$ ($0 \leq a \leq 1$), and the material of the gate electrode 15 is $M(Si_{1-c}Ge_c)$ ($0 \leq c \leq 1$). The MGe ratios a and c (MGE ratio in M(SiGe)) of both electrodes are different ($a \neq c$).

According to the first embodiment, the work functions of MSi and MGe are values intrinsic to material. In the work function range of both compounds MSi and MGe, the MGe ratio has a stable correlation with the work function. Thus, Ge is doped to at least one gate electrode, and thereby, the work function of individual gate electrodes is arbitrarily controlled to a certain value. The gate electrode material M(SiGe) has high heat resistance; therefore, the work function is not variable under heat treatment lower than the temperature described later. The cause of influencing the work function is the gate electrode material M(SiGe) having the depth from the interface to several nm, and not part of impurity segregated from the interface with gate insulator. Thus, a desired work function is obtained, and also, variations from there are small as compared with the work function control using impurity only. As seen from the foregoing features, the correlation between the MGe ratio and the work function is stable. Therefore, the gate electrode material M(SiGe) is applicable to a desired threshold voltage because the work function is controlled using the MGe ratio. Although described in detail in the following fourth embodiment, the MGe composition (a or c) of only one gate electrode is set to 0, and thereby, the work function is controllable in a wider range if B is doped in particular.

According to the first embodiment, the gate electrode material using M(SiGe) has a variable range of the work function including the range required for both n- and p-MISFETs. Therefore, the CMISFET of this embodiment is formed using the same kind of compounds with respect to the gate electrode materials of n-MISFET 2 and p-MISFET 3. This serves to prevent the complication of the method of manufacturing the CMISFET of this embodiment and an increase of cost.

According to the first embodiment, if the range of $a \neq c \neq 0$ is given in the MGe composition, M(SiGe) is formed out of SiGe by heat treatment at low temperature. This contributes to low temperature of the manufacture process, and is preferable in view of device design and manufacturing process.

According to the first embodiment, no phenomenon happens such that constitutive elements of the compound M(SiGe) diffuse to channel regions. Therefore, there is no problem that the on/off characteristic of MISFET is degraded.

The metal element M is an element whose silicide having metallically conductive characteristic, and selected from elements such as V, Cr, Mn, Y, Mo, Ru, Rh, Hf, Ta, W, Ir, Co, Ti, Pt, Pd, Zr, Gd, Dy, Ho and Er. The metal element M is properly selected in accordance with the threshold voltage required for various technical generations and temperature conditions of manufacturing process.

For example, if the threshold voltage is set to about 0.2V required for the sub-30 nm technical generation, it is preferable to use metals given below. For fully-depleted MISFET, the metals have a work function of metal silicide positioning around the center of the band gap of Si; in other words, Ni, Ti, Ta, Zr, Co, W, V, Mo and Ir are given. For bulk MISFET devices, the metals have a work function of metal silicide positioning around the edge of the band gap of Si, in other words, Pd, Pt and Er, are given. Elements such as Ni, Pd, Pt, Ti, Zr, Er and Ta are given as metal element M for forming M(SiGe) having high heat resistance.

The heat resistance of Ni(SiGe), Pd(SiGe), Pt(SiGe), $Ti(SiGe)_2$ and $Zr(SiGe)_2$ will be explained below. The compound Ni(SiGe) is formed by mixing NiGe into NiSi, thereby preventing the formation of $NiSi_2$ phase. The $NiSi_2$ phase has higher resistivity than NiSi and is formed at a temperature of about 750° C. in Ni/Si system. Addition of Ge for NiSi prevents the formation of $NiSi_2$ at the temperature higher than 750° C. Therefore, the compound Ni(SiGe) has heat resistance of about 750° C. at least. In the compound Pd(SiGe), the lower the MGe ratio is, the higher the heat resistance becomes. Therefore, the compound Pd(SiGe) has heat resistance of about 600° C. or more and about 750° C. or less. In the compound Pt(SiGe), PtSi has features of segregating and depositing Ge by heat treatment of about 750° C. or more. Therefore, the compound Pt(SiGe) has heat resistance of about 700° C. The compounds $Ti(SiGe)_2$ and $Zr(SiGe)_2$ have heat resistance of about 750° C. Referring to Er and Ta, melting point and eutectic point of ErGex having the composition Ge>Er and Ta3Ge5 are 1387° C. and 1100° C., respectively. Therefore, the elements Er and Ta are excellent in heat resistance, and Si is added (doped) to them, and thereby, the heat resistance is further improved.

Although a difference is made depending on the kind of the metal element M, it is generally excellent in matching of actually used material and manufacturing process to satisfy the conditions $a \leq 0.3$ and $c \leq 0.3$.

For example, if the compound Ni(SiGe) is used, NiSi has a work function smaller than NiGe; therefore, the larger the NiGe ratio becomes, the more increased the work function is. As a result, the NiGe ratio a of the first gate electrode 8 of the n-MISFET 2 is smaller than the NiGe ratio c of the same of the p-MISFET 3, that is, the relation c>a is established. As described later, the NiGe ratio of Ni(SiGe) and the work function have a stable correlation in a range from about 4.6 eV or more and about 5.1 eV or less at least.

Si, SiGe, Ge, strained Si or other channel region materials are used as the foregoing n- and p-channel regions 6 and 13. Incidentally, impurity may be properly doped. In this way, it is possible to complementarily control the threshold voltage using impurity concentration of the channel region.

For example, metal and metal silicide is given as the material of the first and second contact electrodes 11 and 18. It is preferable to use metal silicide MSi formed of the same metal element M as the M(SiGe) used for the first and second gate electrodes 8 and 15 in view of the manufacturing process.

Silicon oxide film, high dielectric constant material film or mixed material film of these are given as the first and second gate insulators 7 and 14. In this case, the high dielectric constant material film has a dielectric constant (permeability) higher than the silicon oxide film. For example, metal silicate (material in which metal ion is doped to silicon oxide) such as Zr silicate and Hf silicate is given as the high dielectric constant material film. Besides, $Si_3N_4$, $Al_2O_3$, $Ta_2O_5$, $TiO_2$, $La_2O_5$, $CeO_2$, $ZrO_2$, $HfO_2$, $SrTiO_3$ and $Pr_2O_3$ are given as the high dielectric constant material film. Required materials are properly selected in accordance with MISFETs of various technical generations. It is preferable in the sub-30 nm technical generation that the equivalent oxide thickness is less than 2 nm.

The isolation region 4 is used for isolating elements such as MISFETs from others, and formed using insulating materials such as $SiO_2$.

Two modification embodiments 1 and 2 of the first embodiment will be described below.

According to the modification embodiment 1, the CMISFET of the first embodiment is applied to a Schottky-source/drain CMISFET. The CMISFET according to the modification embodiment 1 will be described in the points different from the first embodiment with reference to FIG. 2.

Figure 2:
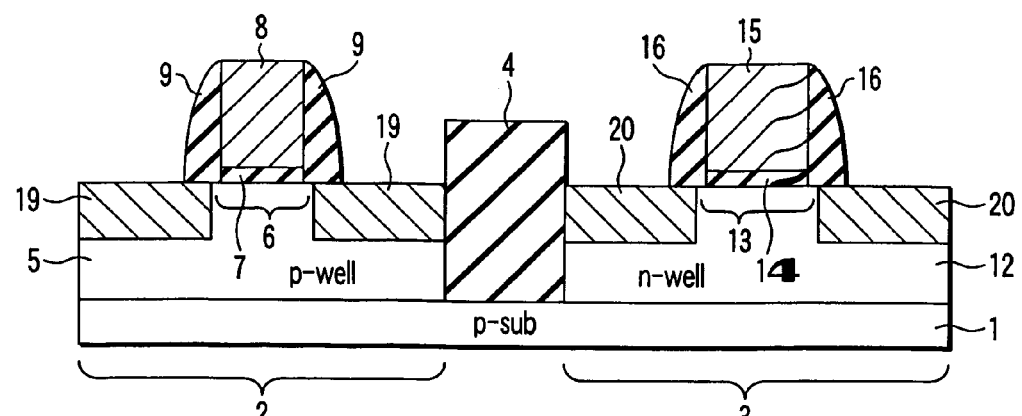
FIG. 2 is a cross-sectional view schematically showing a CMISFET according to a modification embodiment 1 of the first embodiment.

As illustrated in FIG. 2, the place and function of the n-type source/drain region 10 and the first contact electrode 11 shown in FIG. 1 are replaced with a first source/drain electrode 19. Likewise, the place and function of the p-type source/drain region 17 and the second contact electrode 18 shown in FIG. 1 are replaced with a second source/drain electrode 20.

Metal silicide is used as the material of the first and second source/drain electrodes 19 and 20. Considering the manufacturing process, it is preferable to used the same metal element M as the M(SiGe) used for the first and second gate electrodes 8 and 15, that is, MSi. In view of the performance of the CMISFET, it is preferable to properly select metal silicide having low Schottky barrier with respect to each of n-MISFET 2 and p-MISFET 3. For example, it is preferable to use the following rare earth metal silicide having a low Schottky barrier with respect to electrons as the material of the first source/drain electrode 19 of the n-MISFET 2. More specifically, rare earth metal silicide such as, $GdSi_2$, $DySi_2$, $HoSi_2$ and $ErSi_2$ are given. It is preferable to use noble metal silicide having a low Schottky barrier with respect to holes as the material of the first source/drain electrode 20 of the n-MISFET 3. More specifically, noble metal silicide such as PdSi and PtSi are given.

According to the modification embodiment 1, it is possible to control the threshold voltage of the CMISFET using the MGe ratio of the gate electrode M(SiGe), like the first embodiment. The Schottky-source/drain CMISFET according to the modification example 1 is applicable as a ballistic transport device. The ballistic transport device must take low substrate impurity concentration; for this reason, it is desired to carry out threshold voltage control using a gate electrode. Therefore, it is effective in particular to use the gate electrode of the modification embodiment 1.

According to the modification embodiment 2, the second gate electrode 15 of the p-MISFET 3 of the first embodiment has a stacked layer structure given below. More specifically, the second gate electrode 15 is formed of a M(SiGe) layer 15a and a highly-doped polycrystalline SiGe layer 15b. A CMISFET according to the modification embodiment 2 will be described in the points different from the first embodiment with reference to FIG. 3.

Figure 3:
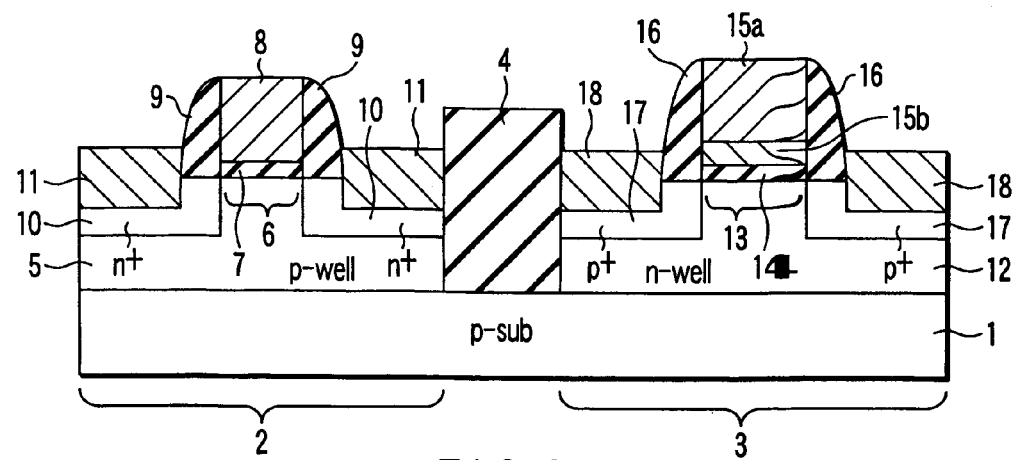
FIG. 3 is a cross-sectional view schematically showing a CMISFET according to a modification embodiment 2 of the first embodiment.

As depicted in FIG. 3, the second gate electrode 15 of the p-MISFET 3 shown in FIG. 1 is formed into a multi-layer structure, which comprises top and bottom layers. That is, the top layer is a M(SiGe) layer 15a; on the other hand, the bottom layer is a high B concentration polycrystalline SiGe layer 15b.

According to the modification embodiment 2, the work function of the second gate electrode 15 of the p-MISFET 3 determines depending on the bottom layer, that is, high B concentration polycrystalline SiGe layer 15b. Thus, a particularly preferable M of M(SiGe) is selected as the material of the first gate electrode 8 of the n-MISFET 2. This serves to increase the degree of freedom in the selection of M(SiGe). The high B concentration polycrystalline SiGe is variable in a work function range adaptable to the p-MISFET, that is, a range from about 4.7 eV or more to about 5.2 eV or less based on the Ge ratio (ratio of Ge in SiGe). The polycrystalline SiGe has B solubility higher than polycrystalline Si. Therefore, B is doped at high concentration as compared with other impurities, so that depletion of gate electrode is prevented. In addition, B in the compound SiGe does not segregate from the interface only, but is uniformly distributed in crystal. Thus, this serves to reduce the influence on the work function by variations of impurity concentration.

According to the modification embodiment 2, the M(SiGe) layer 15a is formed as the top layer of the second gate electrode 15. In this way, specific resistance is reduced as compared with the case where the gate electrode is formed of a highly doped polycrystalline SiGe single layer. It is preferable that the highly doped polycrystalline SiGe layer 15b is formed thin in the light of the reduction of specific resistance. It is preferable that the thickness of the M(SiGe) layer 15a is equal to the height of the gate electrode 8 in view of the manufacturing cost.

As shown in the manufacturing process described later, Ni is deposited to the polycrystalline SiGe to form a compound Ni(SiGe). In this case, impurity is previously doped to a portion functioning as the highly doped polycrystalline SiGe layer 15b. In the process of forming the compound Ni(SiGe), the film thickness of Ni is controlled so that the Ni(SiGe) layer is formed thinner than the thickness of second gate electrode of the p-MISFET 3. In this manner, the highly doped polycrystalline SiGe layer 15b is formed.

Second Embodiment

A CMISFET according to the second embodiment will be described below in the point different from the first embodiment. The CMISFET of the second embodiment is based on the same technical concept as the CMiSFET of the first embodiment. However, the second embodiment differs from the first embodiment in that C is doped to the gate electrode. Therefore, the CMISFET of the second embodiment has the same cross-sectional structure as the first embodiment. Thus, the CMISFET of the second embodiment will be described below with reference to FIG. 1.

A compound M(SiGeC) of metal element M and group IV semiconductor element SiGeC is used as the material of the first and second gate electrodes 8 and 15. In the composition, group IV semiconductor elements, that is, Ge and C are solid-soluble in at least one gate electrode. More specifically, the material of the first gate electrode 8 is $M(Si_{1-a-b} Ge_a C_b)$ ($0 \leq a \leq 1$, $0 \leq b \leq 0.02$, $0 \leq a+b \leq 1$). The material of the second gate electrode 15 is $M(Si_{1-c-d} Ge_c C_d)$ ($0 \leq c \leq 1$, $0 \leq d \leq 0.02$, $0 \leq c+d \leq 1$). The MGe ratios (a and c) of both electrodes are different, and any one of MC ratios (b and d) takes a limited value ($a \neq c$ or either b or $d \neq 0$).

According to the second embodiment, the gate electrode material M(SiGeC) has improved heat resistance as compared with M(SiGe). Thus, if both gate electrodes contain C in the CMISFET of the second embodiment, the CMISFET is applicable to the manufacturing process requiring heat treatment at higher temperature.

According to the second embodiment, C contained in M(SiGeC) compensates strain by Ge having an atomic radius larger than Si. Therefore, the compound of metal and group IV semiconductor element is further stabilized. Incidentally, it is found that about 1% C compensates about 10% strain of Ge.

According to the second embodiment, C contained in M(SiGeC) has an effect of preventing the diffusion of impurity B. Therefore, if B is doped, the compound of metal and group IV semiconductor element is kept at high impurity concentration after high heat treatment is carried out.

According to the second embodiment, the MC ratio is controlled, and thereby, it is possible to complementarily control the work function. The MC ratio (MC ratio in M(SiGeC)) is within the foregoing range, and thereby, C is solid-soluble in the gate electrode with excellent crystallinity.

If a compound $Si_{1-b} C_b$ ($0 \leq d \leq 0.02$) of metal element M and group IV semiconductor element SiC is used as the gate electrode material, the following effects will be expected. More specifically, the diffusion of impurity B is prevented, and the work function is complementarily controlled.

The second embodiment may be carried out in combination with the foregoing first embodiment or third to fifth embodiments described later.

Third Embodiment

A CMISFET according to the third embodiment will be described in the point different from the first embodiment. The CMISFET according to the third embodiment has features given below. More specifically, several metal elements are used as M of the gate electrode material M(SiGe) of the CMISFET according to the first embodiment, and the M(SiGe) has the same crystal structure. Therefore, the CMISFET of the third embodiment has the same cross-sectional structure as the first embodiment. Thus, the CMISFET of the third embodiment will be described below with reference to FIG. 1.

A compound M(SiGe) of metal element M and group IV semiconductor element is used as the material of the first and second gate electrodes 8 and 15, like the first embodiment. In this case, M is two or more metal elements selected from Ni, Pd and Pt, or Ti and Zr.

The following is an explanation about Ni, Pd and Pt. According to the third embodiment, the foregoing mixed crystal compound has an effect of making strain compensation by controlling NiSiGe ratio, PdSiGe ratio or PtSiGe ratio. Therefore, the compound of metal and group IV semiconductor element is further stabilized. The elements Ni, Pd and Pt have the relation Ni<Pd<Pt in their atomic radius. For example, if the NiSiGe ratio is set larger while the PtSiGe ratio is set smaller in NiPt(SiGe), stain compensation is made because Ge has an atomic radius larger than Si.

According to the third embodiment, each work function of the foregoing NiSiGe, PdSiGe or PtSiGe is a value intrinsic to material. Therefore, the foregoing NiSiGe ratio, PdSiGe ratio or PtSiGe ratio have a stable correlation with the work function in their work function range. As a result, it is possible to complementarily control the work function using NiSiGe ratio, PdSiGe ratio or PtSiGe ratio. For example, the work function of NiSi is about 4.6 eV, and the work function of PtSi is about 4.8 eV. Thus, the PtSiGe ratio is enhanced if it is desired to obtain a work function larger than the variable range of the work function of Ni(SiGe).

The foregoing compounds Ni(SiGe), Pd(SiGe) and Pt(SiGe) have an orthorhombic MnP crystal structure. Thus, the crystal structure is unchanged with a change of the M composition ratio, that is, NiSiGe ratio (NiSiGe ratio in M(SiGe)), PdSiGe ratio (PdSiGe ratio (PdSiGe ratio in M(SiGe)) or PtSiGe ratio (PtSiGe ratio in M(SiGe)). Therefore, the mixed crystal compounds such as Ni(SiGe), Pd(SiGe) and Pt(SiGe) are stable.

Likewise, $Ti(SiGe)_2$ and $Zr(SiGe)_2$ have strain compensation effect, and the $Ti(SiGe)_2$ ratio and the $Zr(SiGe)_2$ ratio have a stable correlation with the work function. Incidentally, $Ti(SiGe)_2$ and $Zr(SiGe)_2$ have an orthorhombic $Si_2Zr$ crystal structure. These $Ti(SiGe)_2$ and $Zr(SiGe)_2$ have a relation of Ti<Zr in their atomic radius.

Fourth Embodiment

A CMISFET according to the fourth embodiment will be described in the point different from the first embodiment. The CMISFET according to the fourth embodiment differs from the first embodiment in that As, P or B is doped to the gate electrode of the CMISFET of the first embodiment. Therefore, the CMISFET of the fourth embodiment has the same cross-sectional structure as the first embodiment. Thus, the CMISFET of the fourth embodiment will be described below while referring to FIG. 1.

Figure 4C:
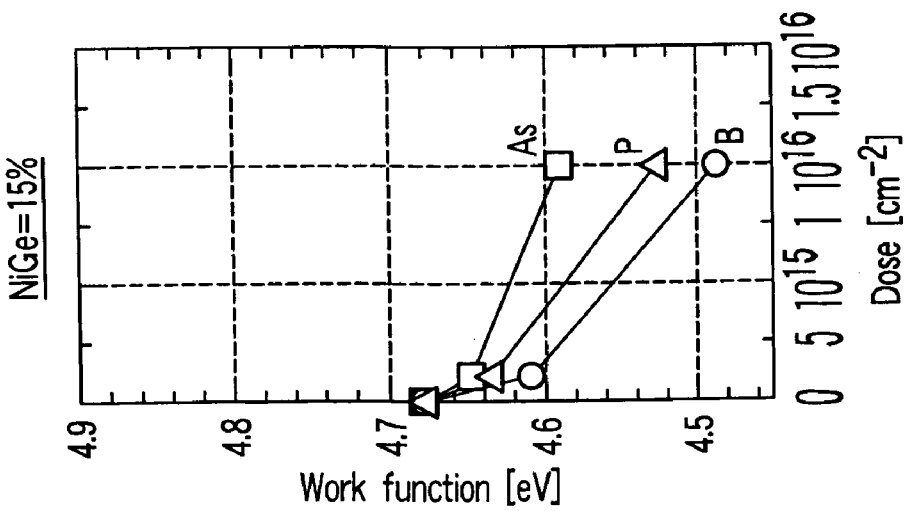
FIGS. 4A to 4C are graphs to explain the relationship between NiGe ratio and dose dependency of work function with respect to impurity seeds according to a fourth embodiment.
Figure 4B:
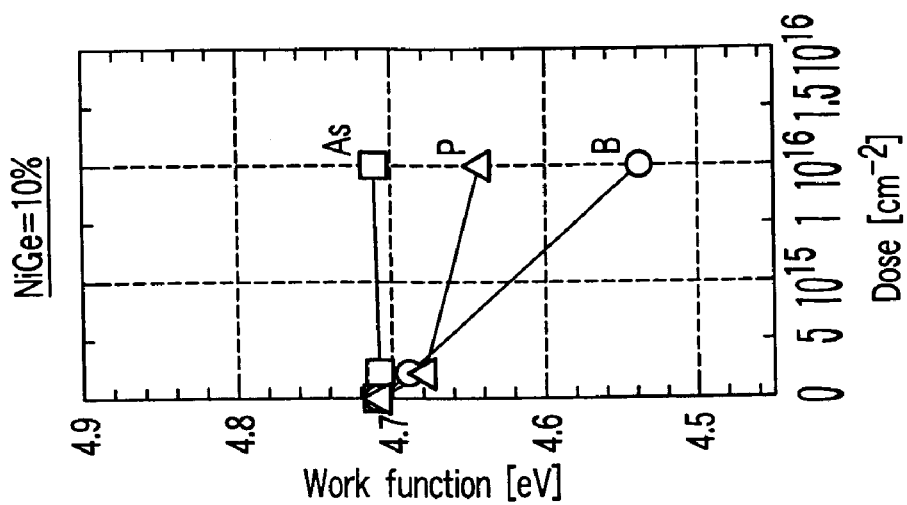
Figure 4A:
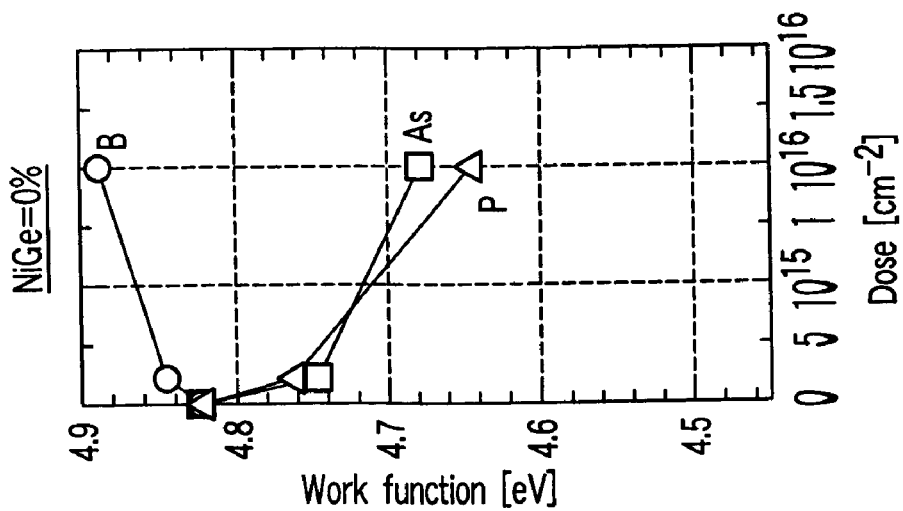

According to the fourth embodiment, a compound M(SiGe) doped with As, P or B is used as the material of the first and second gate electrodes 8 and 15. FIGS. 4A to 4C show the relationship between impurity dose and work function with respect to impurity seeds in the case where when a NiGe ratio is 0%, 10% and 15% in a compound Ni(SiGe). According to Ge addition, it can be seen that a variable range of the work function by impurity is widened to the value, which is impossible in the case of NiSi (i.e., Ge=0%). In particular, if B is doped, the work function has a variable range of 0.4 eV at the maximum between the presence and absence of Ge. This is because an electric dipole formed on the interface is modulated by addition of Ge.

Figure 5B:
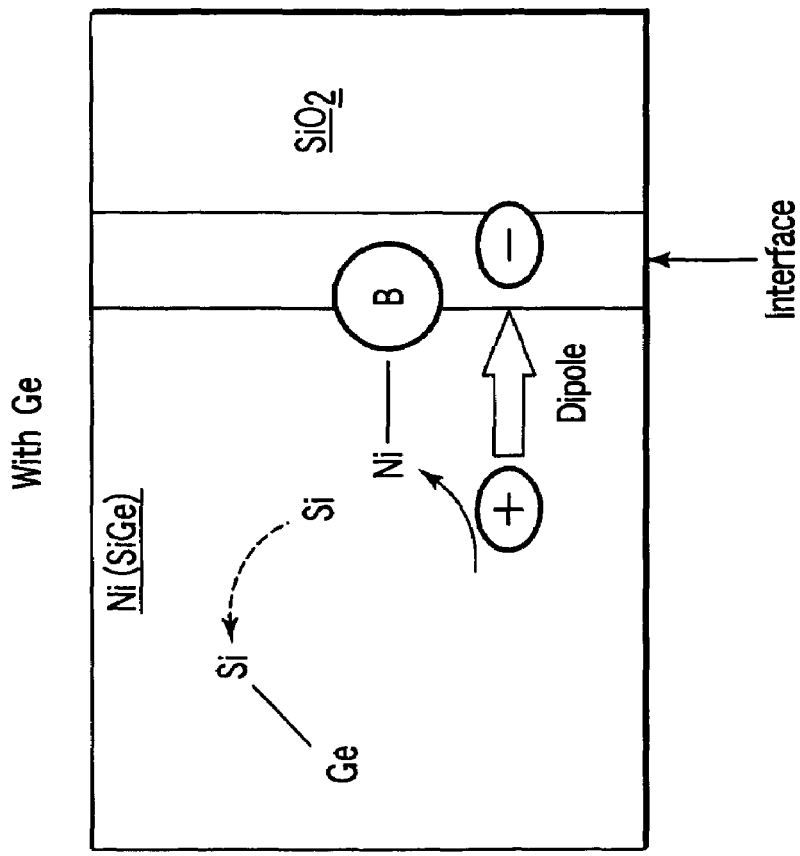
FIGS. 5A and 5B are schematic views showing interface electric dipoles without Ge and with Ge formed respectively when B is doped to gate electrodes 8 and 15 in the fourth embodiment.
Figure 5A:
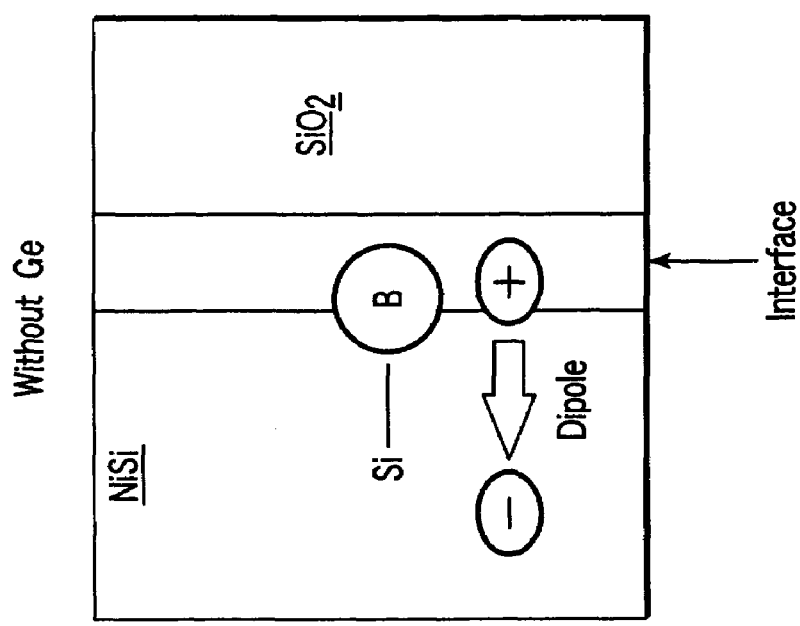

FIGS. 5A and 5B each show interface electric dipoles formed when B is doped to the first and second gate electrodes 8 and 15. FIG. 5A shows the case doped without Ge; on the other hand, FIG. 5B shows the case doped with Ge. In the interface of FIG. 5A, Si—B bonding is mainly made; however, in the case of Ge addition, Ni—B bonding is mainly made as seen from FIG. 5B. This can be readily understood from the relationship of binding energy. In other words, the direction of the interface electric dipole is inverted; for this reason, work function modulating effect by B segregated from the interface is inverted depending on the presence or absence of Ge. The foregoing inversion enables to widen the work function variable range as compared with the case where the MGe composition is 0%. In order to invert the interface electric dipole resulting from B by the doped Ge, Ge concentration higher than B concentration is required. More specifically, an MGe ratio of at least 5% or more to MSi is required in B doping concentration used generally.

Figure 6:
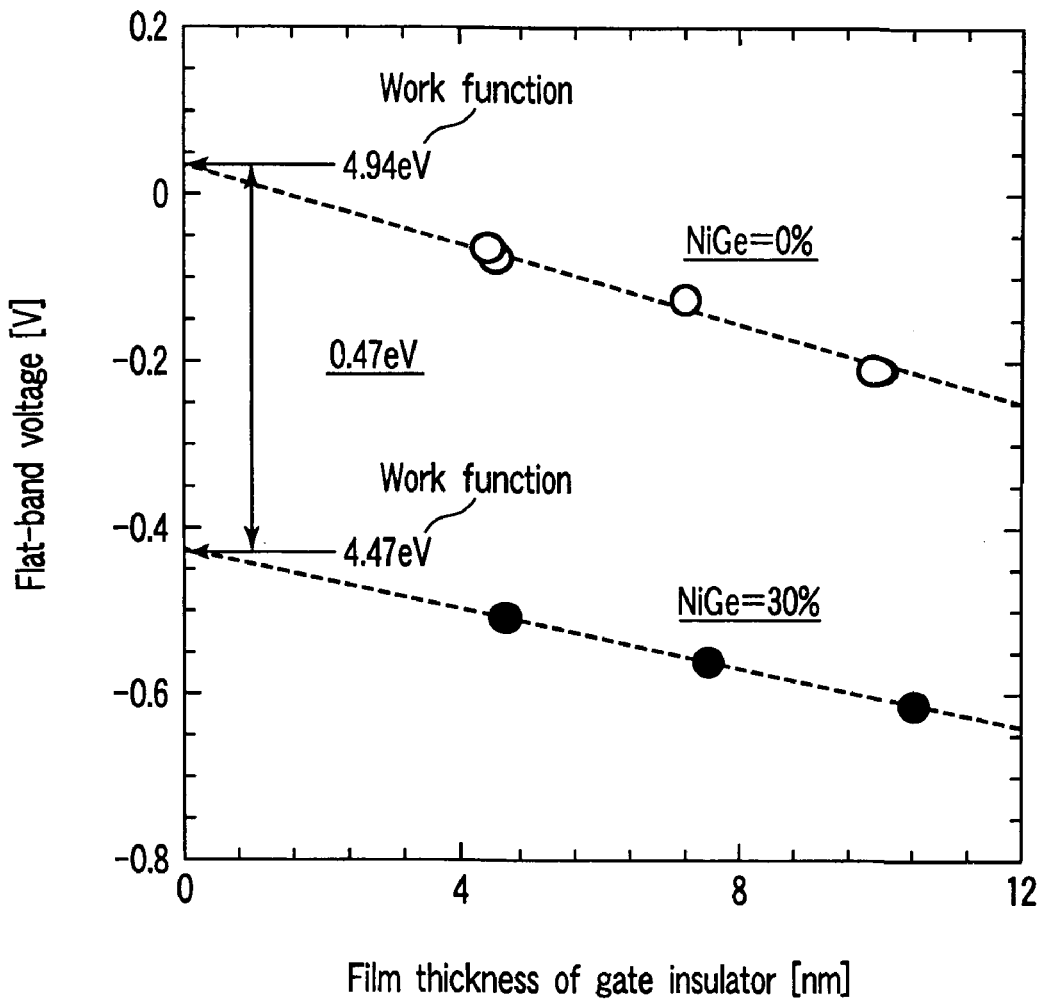
FIG. 6 is a graph to explain the relationship between work function value of Ni(SiGe) and film thickness of gate insulator when the B-doped NiGe ratio is 0% and 30% in the fourth embodiment.

FIG. 6 shows a work function of Ni(SiGe) when a B-doped NiGe ration is 0% and 30%. This is obtained from gate insulator film thickness dependency of flat-band voltage of a MIS capacitor. In a low composition area such that the NiGe ratio is 30% or less, a variable range of ±0.2 eV or more is given around 4.65 eV required for the fully-depleted MISFET device. The foregoing range is the maximum modulation range using the same impurity element. In addition, the Ge composition is further enhanced, and the amount of doped B is controlled, and thereby, the work function is variable (modulated) in a range from 4.2 eV to 5.1 eV. Therefore, it is possible to readily provide a variable range required for devices other than the fully-depleted MISFET device.

As described in the second embodiment, C has the effect of preventing diffusion. Therefore, it is further preferable to dope B to the compound M(SiGeC).

Fifth Embodiment

A CMISFET according to the fifth embodiment will be described in the point different from the first embodiment with reference to FIGS. 7 to 11.

The CMISFET according to the fifth embodiment is formed in a manner that the CMISFET according to the first embodiment is applied to a fully-depleted SOI (silicon On Insulator) MISFET device. Therefore, the CMISFET of the fifth embodiment shown in FIG. 7 has the same cross-sectional structure as the first embodiment. Thus, the CMISFET of the fourth embodiment will be described below while properly referring to FIG. 1.

Figure 7:
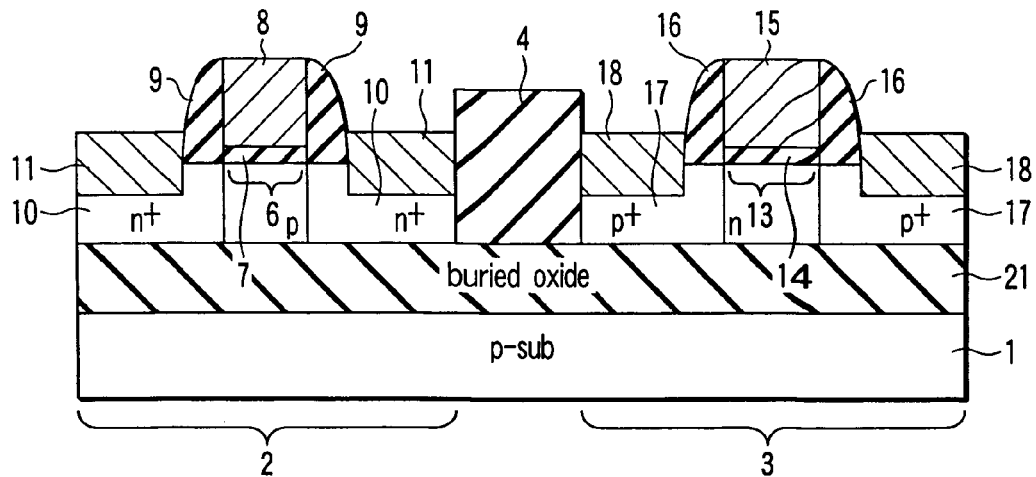
FIG. 7 is a cross-sectional view schematically showing a CMISFET according to a fifth embodiment of the present invention.

As illustrated in FIG. 7, a silicon oxide film 21 is formed on a p-type silicon substrate 1. The following regions, that is, n-source/drain region 10, n-channel region 6, p-source/drain region 17, p-channel region 13 are formed on the silicon oxide film 21. These regions are formed of a single crystal Si layer. In the manner described above, an SOI structure is formed. In addition, n-MISFET 2 and p-MISFET 3 are isolated from each other via an isolation region 4 on the center of the silicon oxide film 21. Thus, the same structure as shown in FIG. 1 is employed. In this way, a fully-depleted SOI-CMISFET is formed.

The single crystal layer comprising the foregoing n-source/drain region 10, n-channel region 6, p-source/drain region 17, p-channel region 13 is an active region of the fully-depleted SOI-CMISFET. The layer thickness is preferably more than 5 nm and less than 10 nm. A region combining the n-source/drain region 10 and the n-channel region 6 is equivalent to the p-well 5 of the first embodiment. On the other hand, a region combining the p-source/drain region 17 and the p-channel region 13 is equivalent to the n-well 12 of the first embodiment.

When the gate electrode of the fully-depleted SOI-CMISFET powers off, these channel regions are all depleted. In the foregoing fully-depleted SOI-CMISFET, it is difficult to control the threshold voltage value using impurity concentration of the channel regions only. For this reason, the threshold voltage is controlled using the work function of the gate electrode in the present stage.

Figure 8:
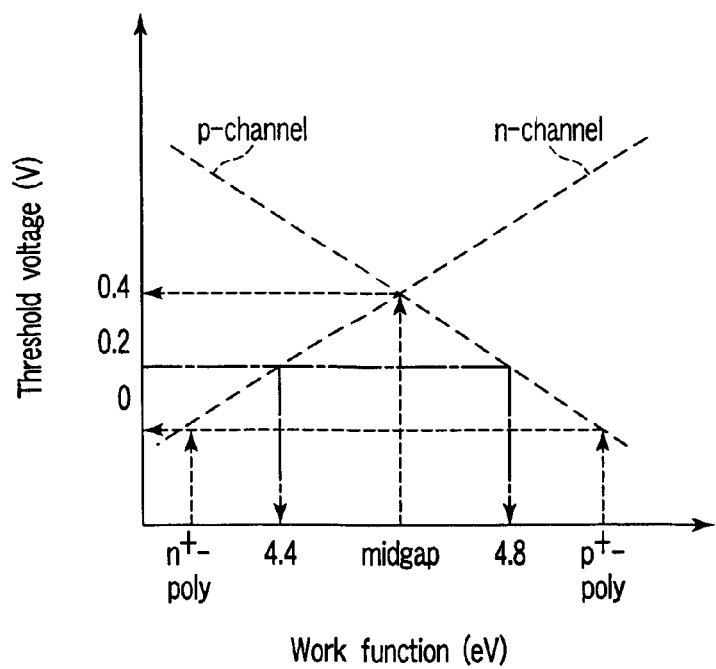
FIG. 8 is a schematic view showing the correlation between threshold voltage and work function in the CMISFET according to the fifth embodiment.

FIG. 8 is a chart showing the correlation between threshold voltage and work function of gate electrode in low substrate impurity concentration suitable for the fully-depleted SOI-CMISFET according to the fifth embodiment. As seen from FIG. 8, if a metal material having Fermi level in mid-gap (work function: about 4.64 eV) is used as the gate electrode material, the fully-depleted MISFET has a threshold voltage of about 0.4 eV. However, the fully depleted SOI-CMISFET requires a threshold voltage of about 0.2 eV if the sub-30 nm technical generation is given as the target. In order to obtain the threshold voltage of about 0.2 eV, it can be seen that the following condition must be satisfied. More specifically, the n-MISFET 2 requires a gate electrode material having a work function of about 4.4 eV. In contrast, the p-MISFET 3 requires a gate electrode material having a work function of about 4.8 eV.

Figure 9:
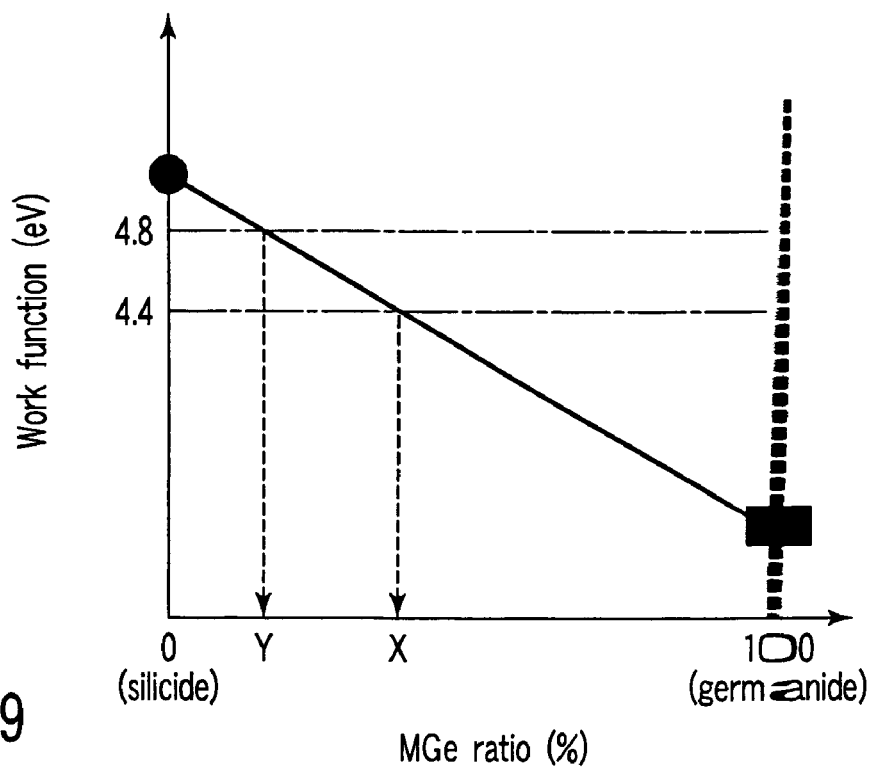
FIG. 9 is a schematic view showing the correlation between work function and MGe ratio in a gate electrode of the CMISFET according to the fifth embodiment.

The following is a description of the correlation between the work function and MGe ratio of M(SiGe) on metal M having a work function of MSi larger than that of MGe. FIG. 9 is a schematic view showing the correlation between the work function and the MGe ratio of M(SiGe) on metal M having a work function of MSi larger than that of MGe in the fifth embodiment. As seen from FIG. 9, the following control is carried out. More specifically, the material of the first gate electrode 8 of the n-MISFET 2 requiring the threshold voltage of about 4.4 eV takes an MGe ratio X. In contrast, the material of the second gate electrode 15 of the p-MISFET 3 requiring the threshold voltage of about 4.8 eV takes an MGe ratio Y.

Figure 10:
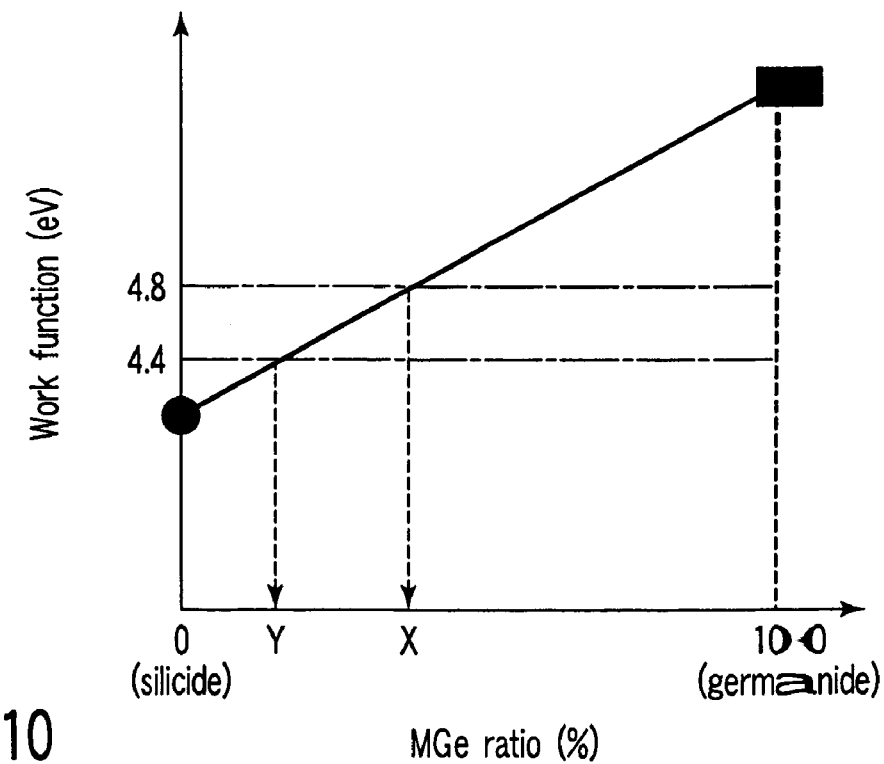
FIG. 10 is a schematic view showing the correlation between work function and MGe ratio in a gate electrode of the CMISFET according to the fifth embodiment.

FIG. 10 is a schematic view showing the correlation between the work function and the MGe ratio of M(SiGe) on metal M having a work function of MSi smaller than that of MGe in the fifth embodiment. The same control as above is carried out with respect to the metal M having a work function of MSi smaller than that of MGe shown in FIG. 10.

As described above, the correlation between the MGe ratio of M(SiGe) and the work function is previously investigated. The MGe ratio is taken so that each gate electrode material of n-MISFET 2 and p-MISFET has a desired work function. In this way, it is possible to simply form gate electrodes having different work function.

The correlation between MGe ratio of M(SiGe) (MGe ratio in M(SiGe)) and the work function will be described below with reference to FIG. 11.

Metals such as Ni, Pt, Ta and Er were used as the gate electrode material to form a MISFET having MSi and MGe gate electrodes. Thereafter, a work function was obtained from the capacitance-voltage characteristic. The composition of MSi and MGe is changed, and thereby, a change of the work function of Ni with respect to the composition change of Ge of M(SiGe) was shown in FIG. 11. In these materials, MSi has a work function lower than that of MGe. As seen from FIG. 11, a stable correlation is given between the NiGe ratio of Ni(SiGe) and the work function in a range from about 4.6 eV or more to about 5.1 eV in Ni(SiGe). From the result, it can be seen that the same correlation as Ni has will be obtained between the work function and the MGe ratio with respect to other M, where MSi and MGe have the same crystal structure as NiSi and NiGe.

A CMISFET will be manufactured referring to FIG. 11 and FIG. 4. For example, the following n-type and p-type fully-depleted SOI-MISFETs are given. More specifically, the n-type and p-type fully-depleted SOI-MISFETs have a gate oxide film having a film thickness of about 1 nm and substrate impurity concentration $5\times10^{16}$ cm$^{-3}$. In the n-type and p-type fully-depleted SOI-MISFETs, the following gate electrodes are required in order to obtained a threshold voltage of about 0.2 eV. The gate electrodes individually need to have work functions of about 4.4 eV and about 4.75 eV.

In order to manufacture the foregoing CMISFET, the compound Ni(SiGe) having 10% NiGe ratio is used as the material of the first gate electrode 8 of the n-MISFET 2. On the other hand, the compound Ni(SiGe) having 60% NiGe ratio is used as the material of the second gate electrode 15 of the p-MISFET 3. In this case, the CMISFET is manufactured via a process of doping impurity to the first electrode 8 with concentration $1 \times 10^{16}$ cm$^{-2}$. For example, P is used as the impurity seed.

The first to third methods of manufacturing the CMISFET according to the fifth embodiment will be described below with reference to FIGS. 12A to 12D to FIGS. 14A to 14D. For convenience of explanation, Ni(SiGe) is used as the gate electrode material, and a silicon thermal oxide film is used as the gate insulator. The numerical values given in the following description are set on the assumption of the sub-30 nm technical generation.

The first method of manufacturing the fully-depleted CMISFET device shown in FIG. 7 will be described below with reference to FIGS. 12A to 12D. According to the first method, polycrystalline SiGe having different Ge ratio is deposited on each of n-MISFET 2 and p-MiSFET. In this way, the NiGe ratio is controlled.

Figure 12A:
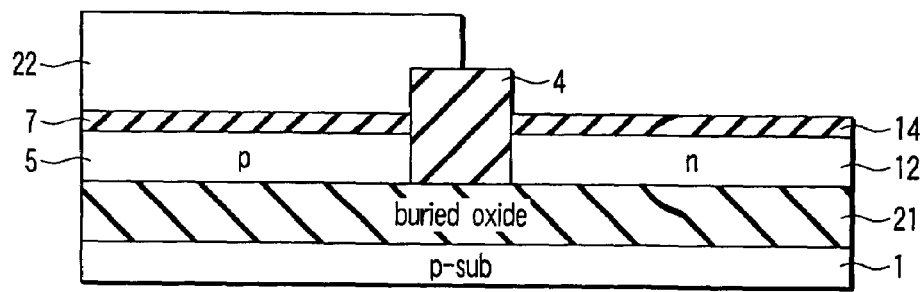
FIGS. 12A to 12D are cross-sectional views stepwise showing a first method of manufacturing the CMISFET according to the fifth embodiment.

As shown in FIG. 12A, a p-type silicon substrate 1 is first formed using the conventional SOI substrate formation process and the shallow trench isolation (STI) process as the isolation process. Then, a silicon oxide film 21 is formed thereon, and further, a single crystal Si layer is formed in a state of being isolated via an isolation region 4.

Next, p-well 5 (p-type impurity region) and n-well 12 (n-type impurity region) each having a depth of about 14 nm are formed according to ion implantation. Thereafter, the surface of the p-well 5 and the surface of the n-well 12 are formed with first and second gate insulators 7 and 14 having a thickness of about 1 nm, respectively.

Thereafter, polycrystalline SiGe 22 is deposited on the p-well 5 to have a thickness of about 30 nm in combination with chemical vapor deposition (CVD) and lithography. The Ge ratio of the polycrystalline SiGe 22 on the p-well 5 takes the same value as the NiGe ratio capable of obtaining a desired threshold voltage in the n-MISFET 2.

In this case, as the bonding method, separation by implanted oxygen (SIMOX) or epitaxial layer transfer (ELT) may be employed as the SOI substrate formation process. Local oxidation method or mesa isolation process may be employed as the isolation process in addition to STI.

Figure 12B:
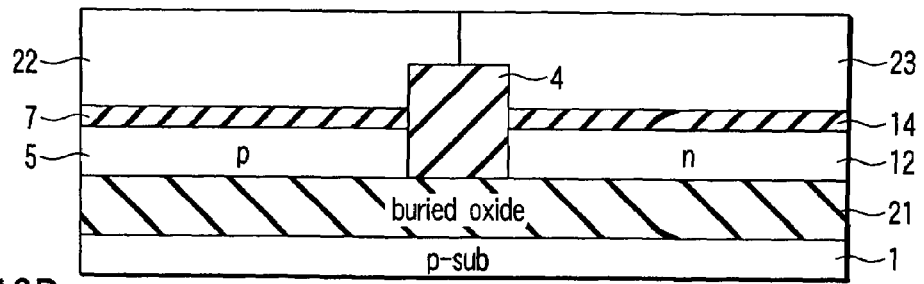

As illustrated in FIG. 12B, polycrystalline SiGe 23 on the n-well 12 to have a thickness of about 30 nm in combination with CVD and lithography. In also case, the Ge ratio of the polycrystalline SiGe 23 on the n-well 12 takes the same value as the NiGe ratio capable of obtaining a desired threshold voltage in the p-MISFET 3.

Figure 12C:
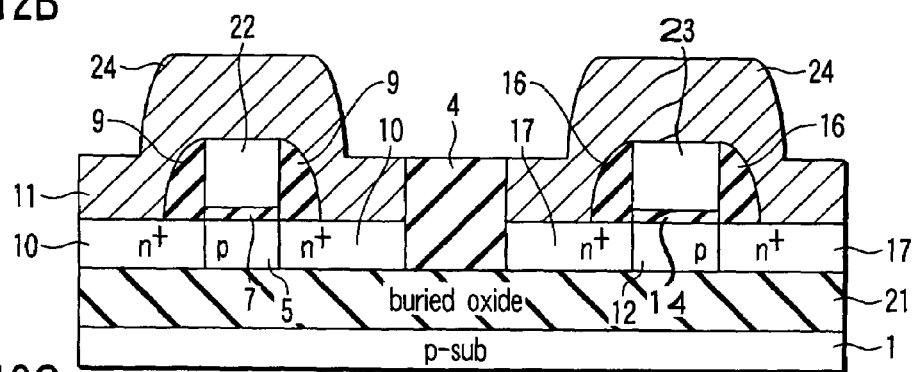

As depicted in FIG. 12C, the polycrystalline SiGe 22 on the p-well 5 and the polycrystalline SiGe 23 on the n-well 12 are formed according to lithography and anisotropic etching. As and B are doped according to ion implantation to form n-source/drain region 10 and p-source/drain region 17. Thereafter, first and second gate sidewalls 9 and 12 are formed. Then, an Ni film 24 is deposited to have a film thickness of 10 nm.

Figure 12D:
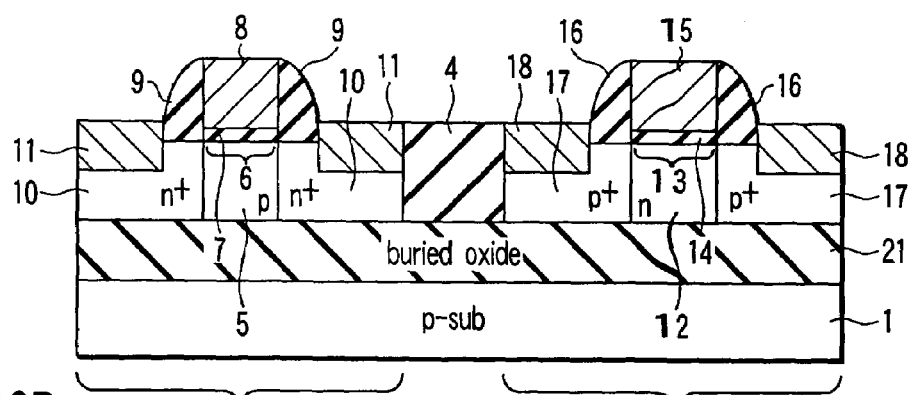

As seen from FIG. 12D, heat treatment of about 350° C. is carried out, and thereby, the polycrystalline SiGe 22 on the p-well 5 and the polycrystalline SiGe 23 on the n-well 12 are formed as metal germanous-silicide. Simultaneously, each upper portion of the n-source/drain region 10 and p-source/drain region 17 is formed as metal silicide to form first and second contact electrodes 11 (NiSi) and 18 (NiSi) having a thickness of about 23 nm.

In FIG. 12D, first and second gate electrodes 8 Ni(SiGe) and 15 Ni(SiGe) formed of polycrystalline SiGe 22 and 23 are formed thicker than first and second contact electrode NiSi formed of single crystal Si. This phenomenon results from the following reason. More specifically, the polycrystalline Si has less volume density as compared with a single crystal Si, and has the reverse gate line width effect.

The fully-depleted CMISFET shown in FIG. 7 is manufactured via the foregoing process. The film thickness is controlled in the manner described above, and thereby, the foregoing n- and p-source/drain regions 10 and 17 under first and second contact electrodes 11 and 18 are formed extremely thin. This serves to reduce off-leakage current.

B-doping using ion implantation is carried out with respect to each polycrystalline SiGe after the process of FIG. 12A or FIG. 12B. The same process as above is carried out in second and third methods described later.

The second method of manufacturing the fully-depleted CMISFET shown in FIG. 7 will be described below with reference to FIGS. 13A to 13D. In this case, the points different from the first method will be described below.

The second method has the following features. More specifically, in one gate electrode having a Ge ratio lower than another gate electrode, the Ge ratio is controlled when polycrystalline SiGe is deposited. In contrast, in another gate electrode having higher Ge ratio, the Ge ratio is controlled using Ge ion implantation when polycrystalline SiGe is deposited. For convenience of explanation, the material of the first gate electrode 8 of the n-MISFET 2 has an MGe ratio larger than that of the second gate electrode 15 of the p-MISFET 3.

Figure 13A:
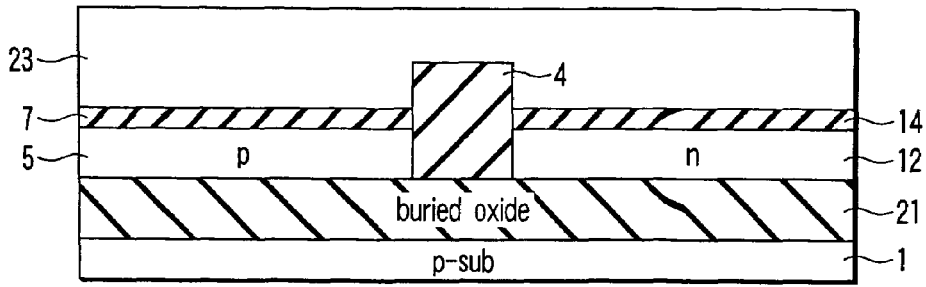
FIGS. 13A to 13D are cross-sectional views stepwise showing a second method of manufacturing the CMISFET according to the fifth embodiment.

As shown in FIG. 13A, an SOI substrate is first prepared. Using ion implantation, p- and n-wells 5 and 12 are formed to have a layer thickness of about 14 nm. Thereafter, each surface of the p- and n-wells 5 and 12 are formed with first and second gate insulators 7 and 14 each having a thickness of about 1 nm. Then, polycrystalline SiGe 23 is deposited on the SOI substrate using CVD to have a film thickness of about 30 nm. The Ge ratio of the polycrystalline SiGe 23 on the SOI substrate takes the same value as the MGe ratio capable of obtaining a desired threshold voltage in the p-MISFET 3.

Figure 13B:
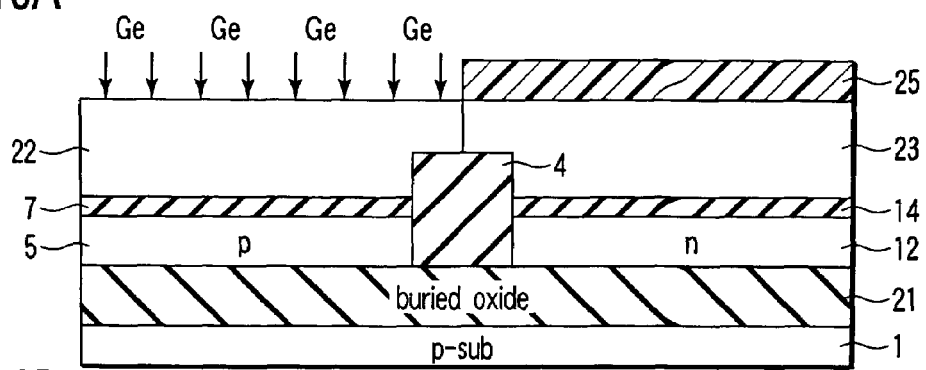

As illustrated in FIG. 13B, Ge is ion-implanted using the polycrystalline SiGe 23 on the n-well 12 as a mask 25. In this case, the Ge ratio of the polycrystalline SiGe 22 on the p-well 5 after the foregoing Ge ion implantation is controlled to take a value capable of obtaining a desired threshold voltage in the n-MISFET 2.

Figure 13C:
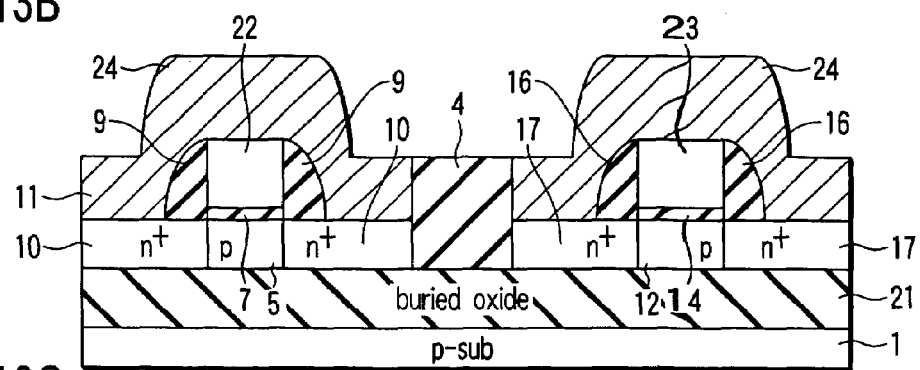
Figure 13D:
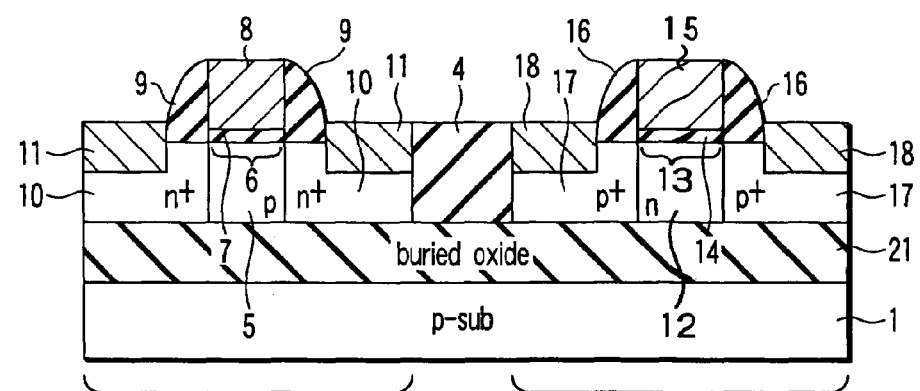

In FIG. 13C and FIG. 13D, the same processes as described in FIG. 12C and FIG. 12D are carried out.

The third method of manufacturing the fully-depleted CMISFET shown in FIG. 7 will be described below with reference to FIGS. 14A to 14D. In this case, the points different from the first method will be described below. The third method has the following features. More specifically, Ge ion implantation is carried out with respect to n-MISFET 2 and p-MISFET 3 in a mutually independent process, and thereby, the NiGe ratio is controlled.

As shown in FIG. 14A, an SOI substrate is first prepared. Using ion implantation, p- and n-wells 5 and 12 are formed to have a layer thickness of about 14 nm. Thereafter, each surface of the p- and n-wells 5 and 12 are formed with first and second gate insulators 7 and 14 each having a thickness of about 1 nm. Then, polycrystalline SiGe 29 is deposited on the SOI substrate using CVD to have a film thickness of about 30 nm. Only surface of the polycrystalline SiGe 29 on the p-well 5 is exposed using lithography, and thereafter, Ge is ion-implanted. In this case, the Ge ratio of the polycrystalline SiGe 29 on the p-well 5 after the foregoing ion implantation takes the same value as the NiGe ratio capable of obtaining a desired threshold voltage in the n-MISFET 2.

As illustrated in FIG. 14B, only surface of the polycrystalline SiGe 29 on the n-well 12 is exposed using lithography, and thereafter, Ge is ion-implanted. In this case, the Ge ratio of the polycrystalline SiGe 29 on the n-well 12 after the foregoing ion implantation takes the same value as the NiGe ratio capable of obtaining a desired threshold voltage in the p-MISFET 2.

In FIG. 14C and FIG. 14D, the same processes as described in FIG. 12C and FIG. 12D are carried out.

The first and third methods are preferable as compared with the second method because they have no restriction such that the polycrystalline SiGe on the well controlling the Ge ratio is lower than the Ge ratio. This is effective in carrying out rapid thermal annealing (RTA) and B doping in particular.

The following is a description of a modification embodiment of the fifth embodiment. According to the modification embodiment, the planer-structure fully-depleted SOI-CMISFET of the fifth embodiment is applied to a Fin structure. A CMISFET according to the modification embodiment will be described in the point different from the fifth embodiment with reference to FIG. 15 and FIG. 16A to FIG. 16D.

Figure 15:
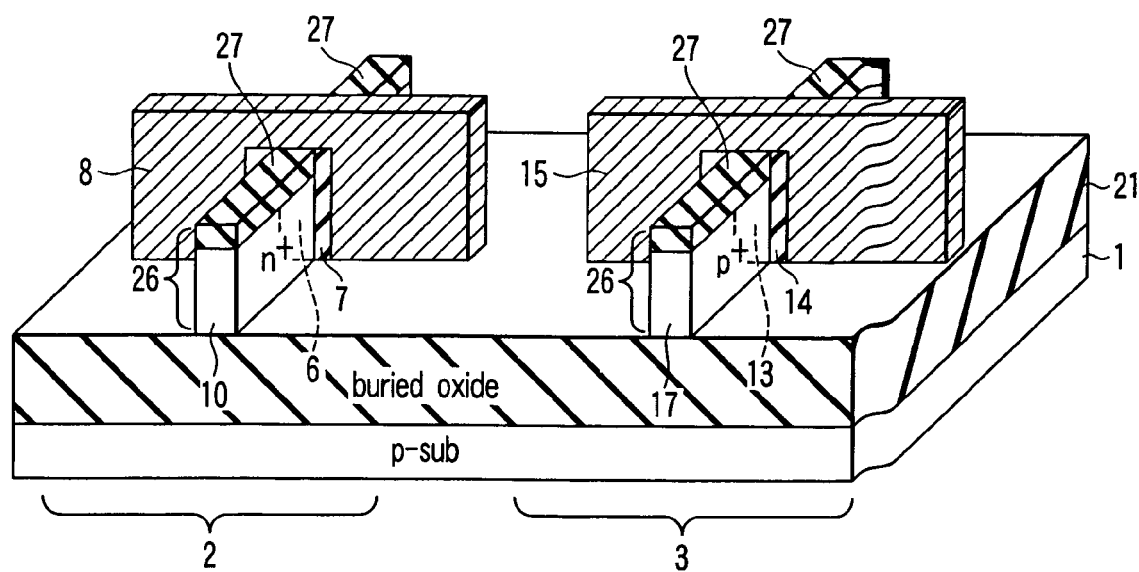
FIG. 15 is a perspective view schematically showing a CMISFET according to a modification embodiment of the fifth embodiment.

As shown in FIG. 15, a silicon oxide film 21 is formed on a p-type silicon substrate 1, and n-MISFET 2 and p-MISFET 3 are formed on the silicon oxide film 21. The n-MISFET 2 and p-MISFET 3 have the same perspective structure except for having different conductivity type. Thus, only n-MISFET 2 will be described below for convenience of explanation. In FIG. 15, a reference numeral 8 denotes a gate electrode, and a rectangular Fin portion 26 is formed perpendicular to the gate electrode and extending to the depth direction of the paper. The Fin portion 26 is composed of n-source/drain regions 10, which are formed on both sides of the gate electrode 8 and formed of a Si layer, and a n-channel region 6 interposed between two n-source/drain regions 10. The Fin portion 26 further includes an insulating layer 27 formed on the Si layer of the n-source/drain regions 10. SiN is used as the insulating layer 27. In the Fin portion 26, the middle portion perpendicular to the first gate electrode 8 is an n-channel region 6, and the n-source/drain regions 10 are positioned via the n-channel region 6. Therefore, the Fin portion 26 is equivalent to the p-well region 5 of the first embodiment. The first gate electrode 8 is formed perpendicularly to cover the middle portion of the Fin portion 26, with a first gate insulator 7 interposed therebetween.

In FIG. 15, there is shown a double-gate CMISFET, and each of the opposed main surfaces of the Fin portion 26 has a channel region. Of course, The Fin portion 26 is applicable to other three-dimensional structure CMISFETs. For example, in a Fin structure tri-gate CMISFET, a single Si layer is used as the Fin portion 26, and the top surface is formed as a gate in addition to both main surfaces of the Fin portion 26. Besides, a planer double-gate CMISFET and vertical double-gate CMISFET may be employed. In the three-dimensional structure CMISFET of the modification embodiment, it is extremely difficult to make uniform impurity concentration with respect to the height direction. Thus, the Schottky-source-drain structure may be employed like the modification embodiment of the first embodiment.

The method of manufacturing the semiconductor device of the modification embodiment will be described below with reference to FIGS. 16A to 16D giving the Fin structure CMISFET shown in FIG. 15 as an example.

Figure 16A:
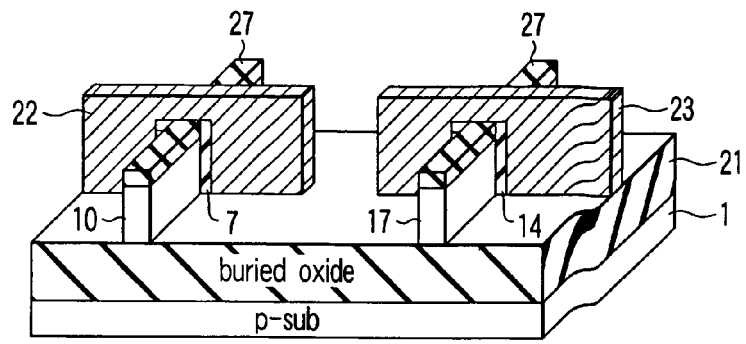
FIGS. 16A to 16D are perspective views stepwise showing a method of manufacturing the CMISFET according to the modification example of the fifth embodiment.

As shown in FIG. 16A, a Fin structure is formed using the conventional process. An SOI substrate is prepared, and thereafter, the following elements are formed using ion implantation, CMP and lithography. The elements are silicon oxide film 21, n- and p-source/drain regions 10, 17, insulating layer 27, first and second gate insulators 7, 14, polycrystalline SiGe 22 and 23 having different Ge ratio.

Figure 16B:
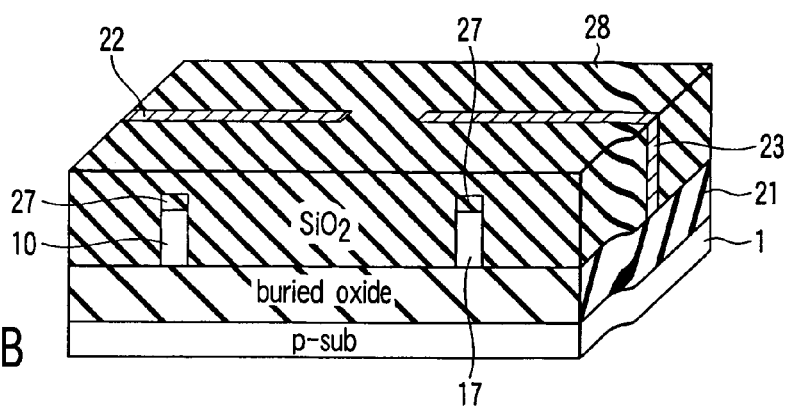
Figure 16C:
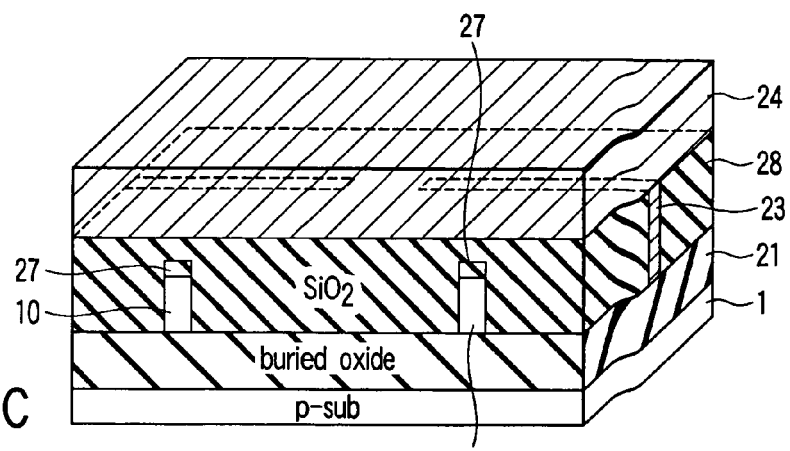

As illustrated in FIG. 16B, a silicon oxide film 28 is deposited, and thereafter, CMP is carried out to expose only surfaces of both polycrystalline SiGe 22 and 23. As depicted in FIG. 16C, a Ni film 24 is vapor-deposited by a layer thickness of about half the height of polycrystalline SiGe 22 and 23.

Figure 16D:
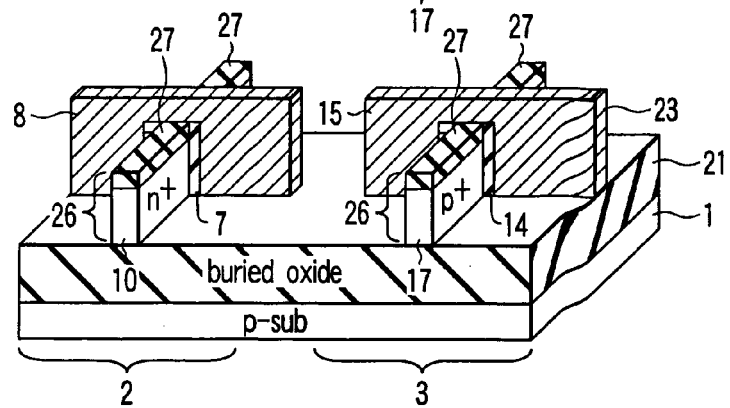

As seen from FIG. 16D, heat treatment of about 350° C. is carried out, and thereby, the polycrystalline SiGe 22 and 23 are formed into a germanous-silicide. In this way, first gate electrode 8 (Ni(SiGe)) and second gate electrode 15 (Ni(SiGe)) are formed. Thereafter, non-reacted Ni and silicon oxide film 28 are etched, and thereby, the Fin structure CMISFET shown in FIG. 15 is manufactured.

According to the foregoing embodiments, a stable correlation is given between the change of the gate electrode material and the work function. In this way, it is possible to improve the controllability of the work function with respect to a desired threshold voltage value. In addition, the variable range of the work function includes the range required for both n- and p-MISFETs in a device including both n- and p-MISFETs on the same substrate. In this way, it is possible to provide a semiconductor device, which can prevent complication and high cost in the manufacturing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate;
   an n-type semiconductor device and a p-type semiconductor device, each being formed on the silicon substrate,
   the n-type semiconductor device including:
      an n-channel region formed on a surface of the silicon substrate;
      an n-type source region and an n-type drain region formed opposite to each other on a surface of the silicon substrate interposing the n-channel region therebetween;
      a first gate insulator formed on the surface of the n-channel region between the n-type source region and the n-type drain region; and
      a first gate electrode formed on the first gate insulator, and formed of a first mixed crystal compound of a metal element M and a first group-IV semiconductor element $Si_{1-a}Ge_a$, where $0 \leq a \leq 1$, Ge included in the first gate electrode being more than 5% with respect to Si, and the first mixed crystal compound being in contact with the first gate insulator;
   the p-type semiconductor device including:
      a p-channel region formed on a surface of the silicon substrate;
      a p-type source region and a p-type drain region formed opposite to each other on a surface of the silicon substrate interposing the p-channel region therebetween;
      a second gate insulator formed on the surface of the p-channel region between the p-type source region and the p-type drain region; and
      a second gate electrode formed on the second gate insulator, and formed of a second mixed crystal compound of the metal element M and a second group-IV semiconductor element $Si_{1-c}Ge_c$, where $0 \leq c \leq 1$, $a \neq c$, and the second mixed crystal compound being in contact with the second gate insulator.

2. The device according to claim 1, wherein the metal element M includes one selected from the group consisting of Ni, Pd, Pt, Ta, Er, Ti and Zr.

3. The device according to claim 1, wherein the device satisfies conditions $a \leq 0.3$ and $c \leq 0.3$.

4. The device according to claim 1, wherein the metal element M is Ni, and satisfies a condition $c > a$.

5. The device according to claim 1, wherein the metal element M includes two or more metal elements selected from the group consisting of Ni, Pd and Pt or includes Ti and Zr.

6. The device according to claim 1, wherein at least one of the first gate electrode and the second gate electrode includes one selected from the group consisting of As, P and B.

7. The device according to claim 1, wherein the p-type semiconductor device and the n-type semiconductor device are configured to be fully depleted.

8. The device according to claim 1, wherein the p-type semiconductor device and the n-type semiconductor device form a complementary pair.

9. The device according to claim 1, wherein the first gate electrode and the second gate electrode include B, and the first gate electrode satisfies a condition $a \neq 0$ while the second gate electrode satisfies a condition $c = 0$.

* * * * *